United States Patent
Kim et al.

(10) Patent No.: US 11,358,864 B2
(45) Date of Patent: *Jun. 14, 2022

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Min Kyoung Kim, Daejeon (KR); Yu Ho Min, Daejeon (KR); Cheol Hee Park, Daejeon (KR); Kyung Moon Ko, Daejeon (KR); Chee Sung Park, Daejeon (KR); Myung Jin Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 290 days.

This patent is subject to a terminal disclaimer.

(21) Appl. No.: 16/463,421

(22) PCT Filed: May 30, 2018

(86) PCT No.: PCT/KR2018/006167
§ 371 (c)(1),
(2) Date: May 23, 2019

(87) PCT Pub. No.: WO2019/004613
PCT Pub. Date: Jan. 3, 2019

(65) Prior Publication Data
US 2020/0377367 A1 Dec. 3, 2020

(30) Foreign Application Priority Data
Jun. 30, 2017 (KR) .................. 10-2017-0083847

(51) Int. Cl.
| | | |
|---|---|---|
| *B01J 37/08* | (2006.01) | |
| *C01B 19/00* | (2006.01) | |
| *H01L 35/16* | (2006.01) | |
| *H01L 35/34* | (2006.01) | |
| *B01J 23/30* | (2006.01) | |

(52) U.S. Cl.
CPC ............ *C01B 19/002* (2013.01); *H01L 35/16* (2013.01); *H01L 35/34* (2013.01); *C01P 2002/30* (2013.01); *C01P 2006/32* (2013.01); *C01P 2006/40* (2013.01)

(58) Field of Classification Search
None
See application file for complete search history.

(56) References Cited

U.S. PATENT DOCUMENTS

| | | | |
|---|---|---|---|
| 6,312,617 B1 * | 11/2001 | Kanatzidis | H01L 31/032 252/62.3 T |
| 9,653,672 B2 | 5/2017 | Rhyee et al. | |
| 2005/0076944 A1 | 4/2005 | Kanatzidis et al. | |
| 2010/0294326 A1 * | 11/2010 | Guo | B22F 7/08 136/238 |
| 2013/0256609 A1 | 10/2013 | Ren et al. | |
| 2016/0099396 A1 | 4/2016 | Lee et al. | |
| 2016/0343928 A1 | 11/2016 | Rhyee et al. | |

FOREIGN PATENT DOCUMENTS

| | | |
|---|---|---|
| CN | 101656292 A | 2/2010 |
| CN | 106830940 A | 6/2017 |
| CN | 108516526 A | 9/2018 |
| JP | 4479628 B2 | 6/2010 |
| JP | 6053186 B2 | 12/2016 |
| KR | 10-2011-0079490 A | 7/2011 |
| KR | 10-1172802 B1 | 8/2012 |
| KR | 10-2014-0116668 A | 10/2014 |
| KR | 10-2017-0041540 A | 4/2017 |
| KR | 10-2018-0048313 A | 5/2018 |

OTHER PUBLICATIONS

Adouby et al., "Structure and temperature transformation of SnSe. Stabilization of a new cubic phase $Sn_4Bi_2Se_7$", Z. Kristallogr, 1998, vol. 213, pp. 343-349.

Adouby et al., "X-ray diffraction, $^{119}$Sn Mössbauer and thermal study of SnSe—$Bi_2Se_3$ system", Journal of Alloys and Compounds, 2008, vol. 453, pp. 161-166.

International Search Report (PCT/ISA/210) issued in PCT/KR2018/006167, dated Sep. 7, 2018.

Du, B-L., et al, "Synthesis and thermoelectric properties of nonstoichiometric AgSbTe2+compounds," Acta Phys. Sin., 2011, vol. 60, No. 1, pp. 018403-1-018403-7.

\* cited by examiner

*Primary Examiner* — Sheng H Davis
(74) *Attorney, Agent, or Firm* — Birch, Stewart, Kolasch & Birch, LLP

(57) ABSTRACT

A chalcogen-containing compound of the following Chemical Formula 1 which exhibits excellent phase stability at a low temperature, particularly at a temperature corresponding to the driving temperature of a thermoelectric element, and also exhibits an excellent thermoelectric performance index through an increase in a power factor and a decrease in thermal conductivity, a method for preparing the same, and a thermoelectric element including the same:

$$V_{1-x}M_xSn_4Bi_2Se_{7-y}Te_y \qquad \text{[Chemical Formula 1]}$$

In the above Formula 1, V is a vacancy, M is an alkali metal, x is greater than 0 and less than 1, and y is greater than 0 and less than or equal to 1.

12 Claims, 11 Drawing Sheets

CHALCOGEN-CONTAINING COMPOUND, ITS PREPARATION METHOD AND THERMOELECTRIC ELEMENT COMPRISING THE SAME

CROSS-REFERENCE TO RELATED APPLICATION(S)

This application claims the benefits of the filing date of Korean Patent Application No. 10-2017-0083847 filed with the Korean Intellectual Property Office on Jun. 30, 2017, the entire contents of which are incorporated herein by reference.

TECHNICAL FIELD

The present invention relates to a novel chalcogen-containing compound which exhibits excellent phase stability at a low temperature, particularly at a temperature corresponding to the driving temperature of a thermoelectric element, and also exhibits excellent thermoelectric performance index (ZT) through an increase in a power factor and a decrease in thermal conductivity, a method for preparing the same, and a thermoelectric element including the same.

BACKGROUND ART

Recently, due to resource depict-on and environmental problems caused by combustion, research on thermoelectric conversion materials using waste heat as one of the alternative energy has accelerated.

Energy conversion efficiency of the thermoelectric conversion material depends on ZT, which is the thermoelectric performance index value of the thermoelectric conversion material. Here, ZT is determined according to the Seebeck coefficient, electrical conductivity, thermal conductivity, and the like as shown in the following Mathematical Formula 1, and more specifically, it is proportional to the square of the Seebeck coefficient and the electrical conductivity, and is inversely proportional to thermal conductivity:

$ZT = S^2 \sigma T / K$     [Mathematical Formula 1]

(in Mathematical Formula 1, σ is the electrical conductivity, S is the Seebeck coefficient, K is the thermal conductivity, and T s an absolute temperature).

Therefore, in order to increase the energy conversion efficiency of the thermoelectric conversion element, it is necessary to develop a thermoelectric conversion material having a high Seebeck coefficient (S) or electrical conductivity (σ), and thus exhibiting a high power factor (PF=σS²) or having low thermal conductivity (K).

Among various thermoelectric conversion materials which have been known for a long time, for example, a thermoelectric conversion material having a crystal lattice structure related to or similar to sodium chloride (NaCl), such as PbTe, $Bi_2Te_3$, SnSe, and the like, in which some of lattice sites are vacant, is known to exhibit excellent thermoelectric conversion characteristics. Materials having such a crystal lattice structure exhibit excellent electrical conductivity, and also exhibit low thermal conductivity as some of the lattice sites are vacant. Thus, excellent thermoelectric conversion characteristics can be exhibited.

However, thermoelectric conversion materials having a vacancy in which some of the lattice sites are vacant while having the same face-centered cubic lattice structure as that of sodium chloride as shown in FIG. 1 are almost unknown.

Further, in the case of $Sn_4Bi_2Se_7$ which is one of Sn—Bi—Se based chalcogen-containing compounds, it has the same face-centered cubic lattice structure as that of sodium chloride, and it is known that some lattice sites, specifically about 14.3% of cationic sites, are vacant sites. For reference, FIG. 2 shows a phase stability diagram of typical Sn—Bi—Se based chalcogen-containing compounds, and in the case of $Sn_4Bi_2Se_7$, it is known to have a face-centered cubic lattice structure at a temperature of about 580° C. to 720° C. (a portion indicated by a circle in FIG. 2).

However, in the case of these chalcogen-containing compounds, the phase is stably maintained only at a temperature of about 580 to 720° C., and decomposition occurs in other phases at a lower temperature than this, particularly at a driving temperature of the thermoelectric element, and thus phase stability is not exhibited.

As a result, it has been predicted that the chalcogen-containing compound exhibits its the same face-centered cubic lattice structure as that of sodium chloride and includes some vacant lattice sites and thus exhibits low thermal conductivity and excellent thermoelectric properties. However, as it exhibits poor phase stability at a temperature of about 580° C. or lower corresponding to the general driving temperature of the thermoelectric element, there is a problem that it is very limited in application as a thermoelectric conversion material.

DETAILED DESCRIPTION OF THE INVENTION

Technical Problem

An object of the present invention is intended to provide a novel chalcogen-containing compound which exhibits excellent phase stability at a low temperature, particularly at a temperature corresponding to the driving temperature of a thermoelectric element, and also exhibits an excellent thermoelectric performance index through an increase in power factor and a decrease in thermal conductivity, and a method for preparing the same.

Another object of the present invention is intended to provide thermoelectric element which includes the above-mentioned chalcogen-containing compound and thus exhibits excellent thermoelectric properties.

Technical Solution

In order to achieve the above objects, the present invention provides a chalcogen-containing compound represented by the following Chemical Formula 1:

    [Chemical Formula 1]

wherein, in the above Formula 1, V is a vacancy, M an alkali metal, x is greater than 0 and less than 1, and y is greater than 0 and less than or equal to 1.

The present invention also provides a method for preparing the above-mentioned chalcogen-containing compound including the steps of: mixing respective raw materials of Sn, Bi, Se, Te, and an alkali metal (M) and subjecting the mixture to a melting reaction; heat-treating the resultant product obtained through the melting reaction; pulverizing the resultant product obtained through the heat treatment; and sintering the pulverized product.

In addition, the present invention provides a thermoelectric element including the chalcogen-containing compound.

Hereinafter, the chalcogen-containing compound according to specific embodiments of the present invention, the method for preparing the same, and the thermoelectric element including the same will be described in more detail.

According to one embodiment of the present invention, a chalcogen-containing compound represented by the following Chemical Formula 1 is provided:

$$V_{1-x}M_xSn_4Bi_2Se_{7-y}Te_y \quad \text{[Chemical Formula 1]}$$

wherein, in the above Formula 1, V is a vacancy, M is an alkali metal, 1-x, x, 4, 2, 7-y, and y are molar ratios of V, M, Sn, Bi, Se, and Te, respectively, wherein z is greater than 0 and less than 1, and y is greater than 0 and less than or equal to 1.

The chalcogen-containing compound of the one embodiment is a compound having a vacant site to which an alkali metal (M) and Te are added to a chalcogen-containing compound such as $Sn_4Bi_2Se_7$, and has a crystal lattice structure identical to that of $Sn_4Bi_2Se_7$, that is, a face-centered cubic crystal lattice structure identical to that of sodium chloride.

Specifically, the chalcogen-containing compound of the one embodiment has a vacancy which is a vacant site excluding the sites filled with Se, Sn, Bi, and Te in the face-centered cubic lattice structure, wherein the alkali metal (M) is filled in at least a part of the vacant sites.

Further, in the face-centered cubic lattice structure, the Te is contained by substituting with some of the sites where the Se is filled.

More specifically, in the face-centered cubic lattice structure of the chalcogen-containing compound of the one embodiment, the Se is filled in an anion site of the face-centered cubic lattice, the Sn and Bi are filled in a cationic site of the face-centered cub lattice, and the Te is substituted by replacing some of the sites filled with Se. In addition, the face-centered cubic lattice structure includes vacancies (V) at vacant sites of the remaining cationic sites excluding the sites filled with Sn and Bi, and the alkali metal (N) is filled in at least some of the vacancies (V).

As described above, M of the alkali metal is filled in the vacant site, and Te having a large atomic radius is substituted for a part of Se, and thereby, the cell size and lattice parameter are increased. Specifically, the chalcogen-containing compound of one embodiment exhibits a lattice parameter of 5.975 Å or more, and more specifically 5.975 Å or more and less than 6.000 Å.

As also demonstrated in examples described later, the chalcogen-containing compound of the one embodiment can exhibit excellent stability at room temperature due to the addition of the alkali metal, and at the same time, since the alkali metal does not completely fill the vacant lattice sites and thus some vacant sites remain, it can exhibit low thermal conductivity. Further, the alkali metal, Sn, Bi, and the like filling each cationic site provide electrons while being formed into cations, thereby exhibiting improved electrical conductivity. Since a part of Se substituted with Te, the power factor can be improved, and at the same time, the thermoelectric performance index can be improved due to a decrease in thermal conductivity.

In detail, the chalcogen-containing compound of the one embodiment can exhibit excellent phase stability even at a low temperature, specifically at a temperature range corresponding to the driving temperature of the thermoelectric element (for example, a temperature of about 580° C. or less), because an alkali metal is added to its crystal lattice structure. Such excellent phase stability can be confirmed from the viewpoint that even when the chalcogen-containing compound of the one embodiment is finally produced in the form of a sintered body and then left to stand, decomposition of the compound does not occur, and the same XRD pattern and the same crystal structure are maintained.

At this time, as the alkali metal, at least one alkali metal selected from the group consisting of Li, Na, and K can be used, but Na can be suitably used in consideration of the high electrical conductivity and excellent phase stability of the compound of one embodiment.

Further, the chalcogen-containing compound of the one embodiment can improve the power factor (PF) and the thermoelectric performance index since Te is contained by replacing a part of Se.

The thermoelectric performance index is defined as $ZT=S^2\sigma T/K$ (S: Seebeck coefficient, σ: electrical conductivity, T: absolute temperature, and K: thermal conductivity). The chalcogen-containing compound of one embodiment can exhibit an excellent power factor and thermoelectric performance index due to high electrical conductivity and low thermal conductivity.

On the other hand, the power factor increases as the content of Te substituted with Se increases. Moreover, the lattice thermal conductivity is reduced by the point defect scattering effect of a phonon due to Te substitution. Thereby, the total thermal conductivity also decreases.

Further, in the face-centered cubic lattice structure of the chalcogen-containing compound of the one embodiment, the alkali metal does not completely fill vacancies which are vacant lattice site, and some vacant sites remain. The vacancies are in a state in which atoms of lattice points are deficient in a specific crystal lattice structure. As also demonstrated by examples described below, the vacancies play a very important role in forming the same face-centered cubic lattice structure as that of sodium chloride. It the vacancies are completely filled with the alkali metal (M), Sn, Bi, Se, and Te and eliminated, secondary phases having different structures other than the face-centered cubic lattice structure are formed together, and thus the physical properties such as electrical conductivity are lowered, and there is a problem that it is very limited in application as a thermoelectric conversion material.

In addition, since the vacancy facilitates diffusion of atoms, heat treatment, deformation, precipitation, or phase transformation may be varied depending on the presence or absence of the vacancies. In the case of the chalcogen-containing compound of the one embodiment, the low lattice thermal conductivity can be exhibited by the phonon scattering of the vacancy, and due to this, excellent thermoelectric conversion characteristics can be exhibited.

On the other hand, in Chemical Formula 1, the vacancy (V), alkali metal (M), Sn, Bi, Se, and Te are included in the molar ratios of 1-x, x, 4, 2, 7-y, and y, respectively, wherein x is greater than 0 and less than 1, and y is greater than 0 and less than or equal to 1. When x is 1, vacancies do not exist in the lattice structure, and thus an improvement effect due to the presence of vacancy cannot be obtained. Further, when y is 0, the effect of decreasing the thermal conductivity due to Te substitution can not be expected. When y exceeds 1, there is a possibility of deterioration of thermoelectric properties due to formation of a Te-related secondary phase. Considering a remarkable improvement effect due to the control of the mole ratio of each element including the vacancy, more specifically, x may be 0.05 to 0.5, and y may be 0.1 to 1, and still more specifically, x may be 0.1 to 0.4 and y may be 0.2 to 1. Further, under the conditions that the ranges of x and y are satisfied, y may be 0.1 to 1.5, more specifically 0.5 to 1.5, and still more preferably 0.6 to 1.4. As these respective mole ratios are satisfied, the compound of one embodiment may exhibit superior phase stability due to the addition of an alkali metal while maintaining a unique crystal lattice structure. Due to the vacant site, it can exhibit low thermal conductivity. In addition, the molar ratio of the alkali metal, Bi, etc. which provide electrons, is optimized, and thus the compound of one embodiment can exhibit superior electrical conductivity. Furthermore, as Te is substituted in a part or Se, the power factor increases and simultaneously the thermal conductivity decreases, thereby exhibiting a remarkably excellent thermoelectric performance index.

Specific examples of the chalcogen-containing compound include $V_{0.6}Na_{0.4}Sn_4Bi_2Se_{6.8}Te_{0.2}$, $V_{0.6}Na_{0.4}Sn_4Bi_2Se_{6.2}Te_{0.8}$, $V_{0.6}Na_{0.4}Sn_4Bi_2Se_6Te_1$, and the like.

Considering the remarkable improvement of the thermoelectric performance due to the optimization of the kind and content of the substitution element, the chalcogen-containing compound according to one embodiment of the present invention may be a compound of Chemical Formula 1 wherein x=0.4, the alkali metal M may be Na, y may be 0.2 to 1, x+y may be 0.6 to 1.4, and furthermore, x=0.4, the alkali metal M is Na, y may be 0.8 to 1, and x+y may be 1.2 to 1.4.

As described above, the chalcogen-containing compound of one embodiment solves the problem of poor phase stability of conventional thermoelectric materials such as $Sn_4Bi_2Se_7$, and thus exhibits excellent electrical conductivity and low thermal conductivity due to a unique crystal lattice structure while exhibiting excellent phase stability even at a general driving temperature of a thermoelectric element, and further exhibits a remarkably excellent power factor and thermoelectric performance index. As a result, the chalcogen-containing compound of the one embodiment can be very suitably used as a thermoelectric conversion material in various fields and applications including various thermoelectric cooling systems, thermoelectric power generation systems, and the like.

On the other hand, according to another embodiment the present invention, a method for preparing the above-mentioned chalcogen-containing compound is provided.

Specifically, the preparation method may include the steps of: mixing respective raw materials of Sn, Bi, Se, Te, and an alkali metal (M) and subjecting the mixture to a melting reaction; heat-treating the resultant product obtained through the melting reaction; pulverizing the resultant product obtained through the heat treatment; and sintering the pulverized product.

In the above preparation method, as the raw materials containing Sn, Bi, Se, Te, and alkali metals (M), for example, shot (particle without edges) and/or a powder of Sn, Bi, Se, Te, and an alkali metal may be used. Further, the raw materials including the alkali metal are not particularly limited, but a powder of $M_2Se$ (where M is an alkali metal) may be used.

Further, the mixing of these respective raw materials can be carried out by mixing the raw materials such that the molar ratio of the respective elements in Chemical Formula 1, specifically, the molar ratio of Sn, Bi, Se, Te, and an alkali metal (M) is ratio corresponding to 4:2:7-y:y:x, and then grinding or milling the mixture and optionally pelletizing it. At this time, x and y are the same as described above. The mixture thus formed may be in a powder state, a pellet state, or an ingot state depending on its formation step.

Then, a step of melting the mixture prepared above is carried out.

During the melting step, the reaction between the metal raw materials is performed, and the result of the reaction is obtained in the form of a melt.

Specifically, the melting step can be carried out by charging the mixture into a quartz tube and heating it at a temperature of 700 to 800° C. and more specifically a temperature of 750 to 800° C. under vacuum and in a sealed state. At this time, in order to prevent the reaction between the raw material and the quartz tube, the mixture may be first placed in a carbon crucible and then charged into a quartz tube.

Next, a step of heat-treating the melt obtained through the melting step is carried out. The heat treatment is a step for forming a single phase of a face-centered cubic lattice structure. Specifically, it can be carried out at a temperature of 550 to 640° C., and more specifically, 600 to 640° C. for 24 to 72 hours. Further, the heat treatment may be carried out in a furnace such as an electric furnace, and it can be carried out under a vacuum or inert gas atmosphere.

In addition, the heat treatment step may be carried out in a single step or may be performed in two or more steps.

Further, prior to the heat treatment after the step of preparing the melt, a step of cooling the melt may be further carried out as needed. Through this cooling step, the time of the heat treatment step can be shortened.

The cooling step may be carried out by a conventional method such as natural coning or cold air cooling, and it can be carried out until the temperature of the melt reaches the level of room temperature (23±5° C.)

Further, after the heat treatment step, a step of pulverizing the heat-treated product is carried out.

The pulverizing step may be carried out using previously known methods and devices for producing thermoelectric conversion materials. Through this pulverizing step, a resultant product in a powder state can be obtained.

On the other hand, between the heat treatment step and the pulverization step, a step of cooling the result of the heat treatment step to form an ingot may be further carried out as needed.

At this time, the cooling step may be carried out using various cooling media, and all of the cooling devices/methods previously applied in the manufacturing process of thermoelectric conversion materials can be applied without particular limitation. In the case of forming ingots through this cooling step, a step of pulverizing the ingots may be carried out.

On the other hand, after the pulverizing step described above, a step of sintering the pulverized product is carried out. By progress of this sintering step, the above-mentioned chalcogen-containing compound of one embodiment can be produced in the form of a sintered body. Such a sintering step can be carried out by a spark plasma sintering method or the like that is well-known to those skilled in the art.

The sintering step may be carried out at a temperature of 550 to 640° C. under a pressure of 10 to 100 MPa. More specifically, it may be carried out at a temperature of 600° C. to 640° C. under a pressure of 30 to 100 MPa for 5 to 10 minutes.

After the sintering step, a cooling step may be further carried out as needed.

However, each of the above-described steps may be carried out by applying conventional manufacturing conditions, methods, and devices for forming a thermoelectric conversion material or metal compound such as a chalcogen-containing compound. Specific reaction conditions and methods are described in examples described later, and so an additional description thereof will be omitted.

On the other hand, according to another embodiment of the present invention, a thermoelectric element including the chalcogen-containing compound of the above-mentioned one embodiment as a thermoelectric conversion material is provided. Such a thermoelectric element can include the chalcogen-containing compound (thermoelectric conversion material) of the embodiment as a p-type or n-type thermoelectric conversion material. For this purpose, as the thermoelectric conversion material of the one embodiment, additional p-type or n-type elements may be included in an additionally doped state. However, the kind of p-type element or n-type element and the doping method usable herein are not particularly limited, and elements and doping methods which have been conventionally used for applying thermoelectric conversion materials as p-type or n-type may be applied.

The thermoelectric element may include a thermoelectric element formed by obtaining the p-type or n-type thermoelectric conversion materials in a sintered state, and then processing and molding it, and may also include an insulating substrate and an electrode. The coupling structure of the thermoelectric element, the insulating substrate and the electrode may conform to the structure of a conventional thermoelectric element.

In addition, as the insulating substrate, a sapphire substrate, a silicon substrate, a Pyrex substrate, a quartz substrate, or the like can be used. As the electrode, an electrode containing an arbitrary metal or a conductive metal compound can be used.

As the above-mentioned thermoelectric element includes the thermoelectric conversion material of one embodiment, it can exhibit excellent thermoelectric conversion characteristics, and the like, and it can be suitably applied to a thermoelectric cooling system or a thermoelectric power generation system in various fields and applications.

Advantageous Effects

According to the present invention, a novel chalcogen-containing compound which exhibits excellent phase stability even at a temperature corresponding to the driving temperature of a thermoelectric element, and also exhibits an excellent thermoelectric performance index through an increase in power factor and a decrease in thermal conductivity, and a method for preparing the same, can be provided. In addition, a thermoelectric element exhibiting excellent properties by applying such chalcogen-containing compound can be provided.

BRIEF DESCRIPTION OF THE DRAWINGS

FIG. 1 is a schematic view showing a face-centered cubic lattice structure represented by sodium chloride or the like.

DETAILED DESCRIPTION OF THE EMBODIMENTS

Figure 1:
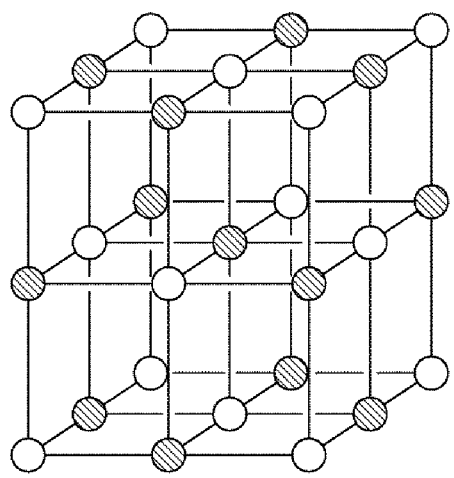
Figure 2:
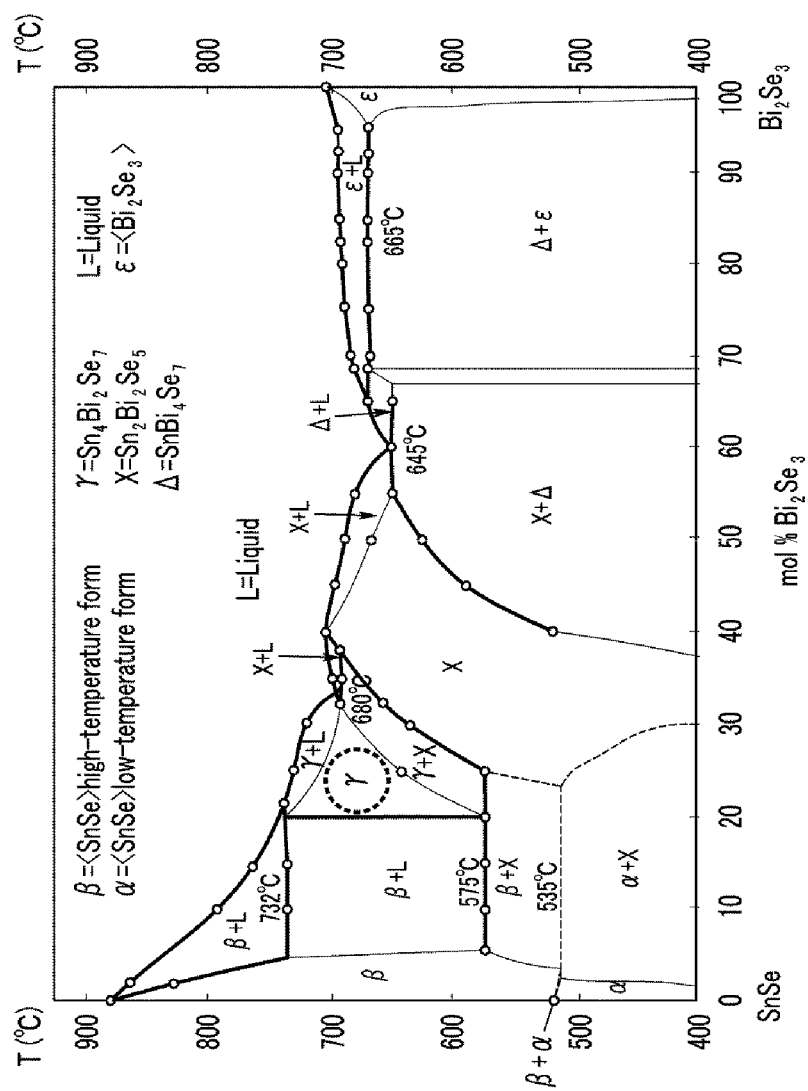
FIG. 2 is a phase stability diagram of typical Sn—Bi—Se based chalcogen-containing compounds.

Hereinafter, the present invention will be described in more detail by way of examples. However, these examples are given to merely illustrate the invention and are not intended to limit the scope of the invention thereto.

Example 1

Preparation of Chalcogen-Containing Compound ($V_{0.6}Na_{0.4}Sn_4Bi_2Se_{6.8}Te_{0.2}$)

The respective powders of Na, Sn, Bi, Se, and Te, which are high purity raw materials, were weighed at a molar ratio of 0.4:4:2:6.8:0.2 in a glove box and placed in a graphite crucible, and then charged into a quartz tube. The inside of the quartz tube was evacuated and sealed. Then, the raw materials were kept at a constant temperature in an electric furnace at 750° C., for 24 hours, and slowly cooled at room temperature.

Thereafter, heat treatment was carried out at a temperature of 640° C. for 48 hours. The quartz tube in which the reaction progressed was cooled with water to obtain an ingot. The ingot was finely pulverized to a powder having a particle size of 75 μm or less, and sintered according to a spark plasma sintering method (SPS) at a pressure of 50 MPa and a temperature of 620° C. for 10 minutes to prepare chalcogen-containing compound of $V_{0.6}Na_{0.4}Sn_4Bi_2Se_{6.8}Te_{0.2}$.

Example 2

Preparation of Chalcogen-Containing Compound ($V_{0.6}Na_{0.4}Sn_4Bi_2Se_{6.2}Te_{0.8}$)

A chalcogen-containing compound of $V_{0.6}Na_{0.4}Sn_4Bi_2Se_{6.2}Te_{0.8}$ was prepared in the same manner as in Example 1, except that the respective powders of Na, Sn, Bi, Se, and Te, which are high purity raw materials, were mixed at a molar ratio of 0.4:4:2:6.2:0.8 in a glove box.

Example 3

Preparation of Chalcogen-Containing Compound ($V_{0.6}Na_{0.4}Sn_4Bi_2Se_6Te_1$)

A chalcogen-containing compound of $V_{0.6}Na_{0.4}Sn_4Bi_2Se_6Te_1$ was prepared in the same manner as in Example 1, except that the respective powders of Na, Sn, Bi, Se, and Te, which are high purity raw materials, were mixed at a molar ratio of 0.4:4:2:6:1 in a glovebox.

Comparative Example 1

Preparation of Chalcogen-Containing Compound ($Sn_4Bi_2Se_7$)

A chalcogen-containing compound of $Sn_4Bi_2Se_7$ was prepared in the same manner as in Example 1, except that the respective powders of Sn, Bi, and Se, which are high purity raw materials, were mixed at a molar ratio of 4:2:7 in a glove box.

Comparative Example 2

Preparation of Chalcogen-Containing Compound ($V_{0.6}Na_{0.4}Sn_4Bi_2Se_7$)

A chalcogen-containing compound of $V_{0.6}Na_{0.4}Sn_4Bi_2Se_7$ was prepared in the same manner as in Example 1, except that the respective powders of Na, Sn, Bi, and Se, which are high purity raw materials, were mixed at a molar ratio of 0.4:4:2:7 in a glove box.

Comparative Example 3

Preparation of Chalcogen-Containing Compound ($NaSn_4Bi_2Se_7$)

A chalcogen containing compound of $NaSn_4Bi_2Se_7$ was prepared in the same manner as in Example 1, except that the respective powders of Na, Sn, Bi, and Se, which are high purity raw materials, were mixed at a molar ratio of 1:4:2:7 in a glove box.

Experimental Example

1. Phase Analysis According to XRD Pattern

Figure 3:
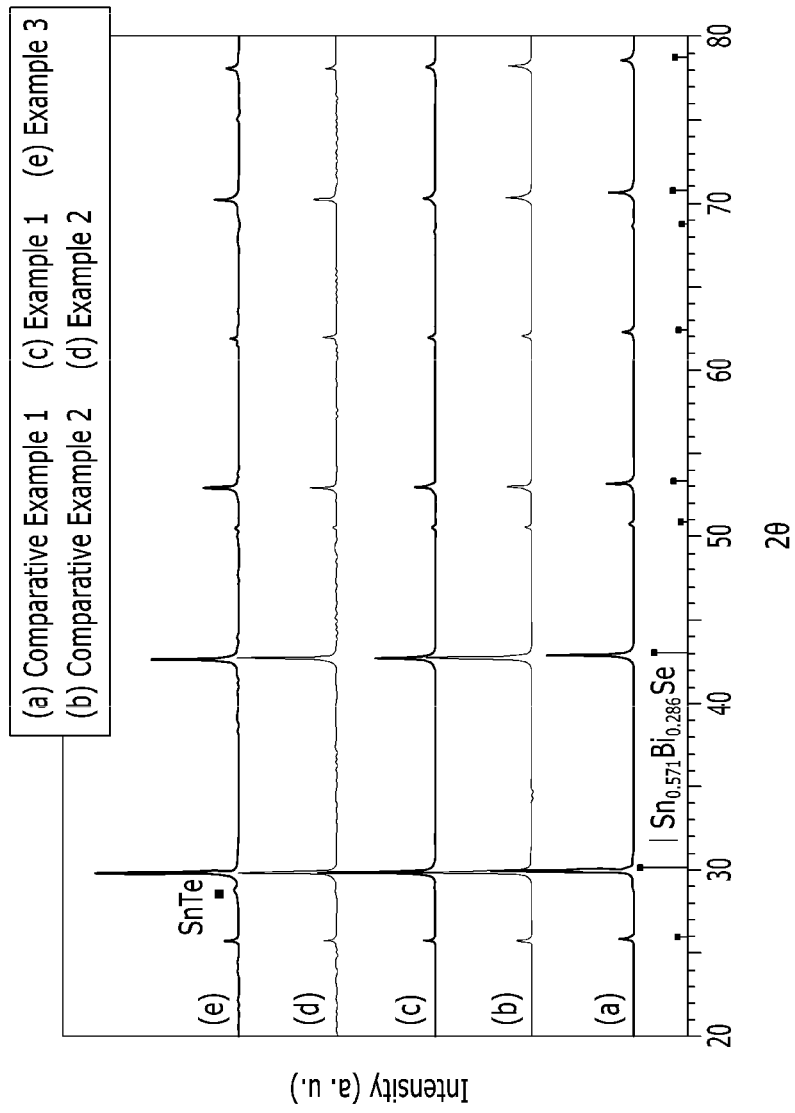
FIG. 3 is a graph showing the results of X-ray diffraction analysis of the chalcogen-containing compound powder just before the sintering step in Examples 1 to 3 and Comparative Examples 1 and 2.

For the chalcogen compounds in a powder state just before the sintering step in Examples 1 to 3 and Comparative Examples 1 to 3, X-ray diffraction analysis was carried out, and the results are shown in FIG. 3. In addition, the results of X-ray diffraction analysis of the powder state just before the sintering step of Comparative Example 3 in which all vacancies were filled are shown in FIG. 4.

Further, the sintered body finally produced through the sintering step in Examples 1 to 3 and Comparative Examples 1 and 2 was gradually cooled from about 620° C. to 300° C. and then cooled again to room temperature (25° C.). Then, the resultant sintered body was maintained in the air atmosphere for 15 days, and X-ray diffraction analysis of each sintered body was performed. The results are shown in FIG. 5.

First, referring to FIG. 3, the chalcogen-containing compounds of Examples 1 to 3 and Comparative Examples 1 and 2 were confirmed to have the same crystal lattice structure as that of $Sn_4Bi_2Se_7$ which was conventionally known to have a face-centered cubic lattice structure at a high temperature. From these results, it was confirmed that the chalcogen-containing compounds of Examples 1 to 3 and Comparative Examples 1 and 2 all had a face-centered cubic crystal lattice structure. However, in Example 3, a small amount of SnTe secondary phase was observed, but since it was not a finally produced sintered body, it was determined to be within the allowable range.

Figure 4:
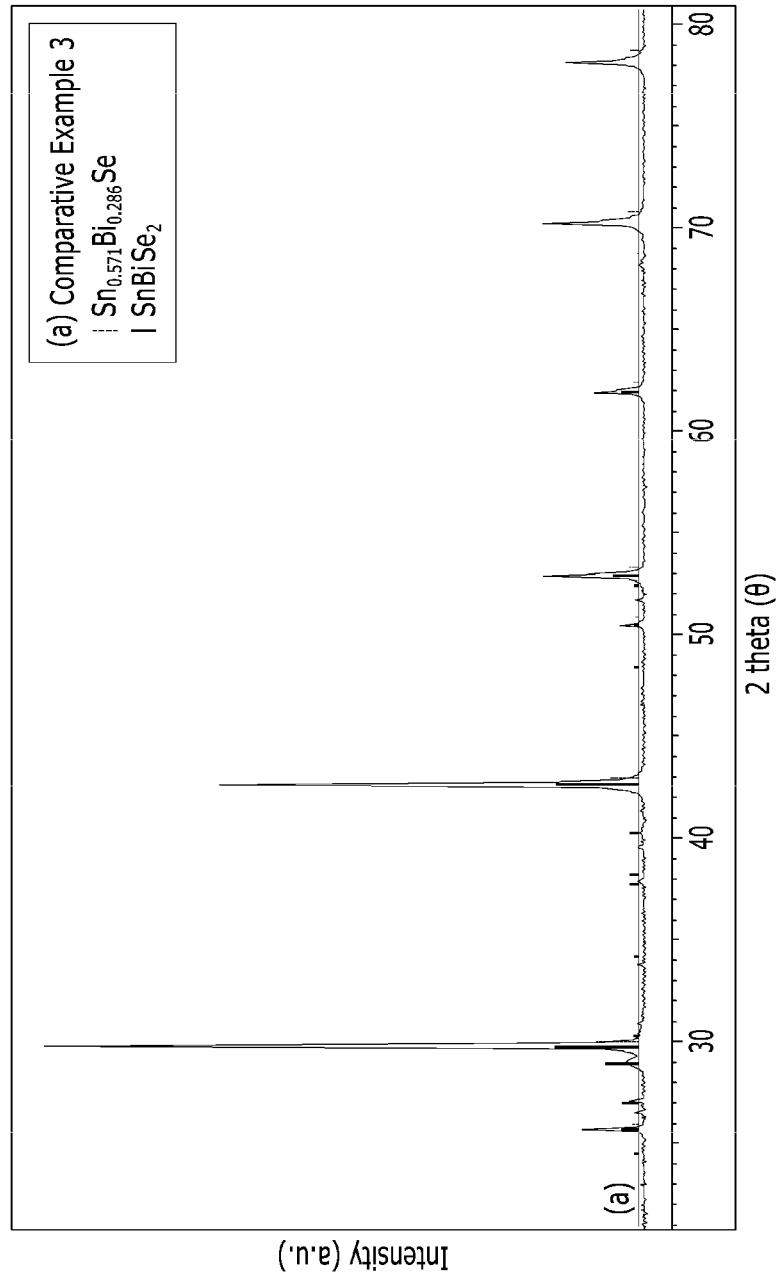
FIG. 4 is a graph showing the results of X-ray diffraction analysis of the chalcogen-containing compound powder just before the sintering step in Comparative Example 3.

On the other hand, referring to FIG. 4, in the chalcogen-containing compound powder before the sintering step of Comparative Example 3 in which Na was filled in all vacant sites, a secondary phase of $SnBiSe_2$ was observed. From this, it can be confirmed that the inclusion of the vacant site is an important part in suppressing the formation of the secondary phase. Further, since the chalcogen-containing compound powder before the sintering step of Comparative Example 3 already contains an excess amount of the secondary phase, analysis of the sintered body after the sintering step and the Te substitution experiment of the sintered body were not carried out.

Figure 5:
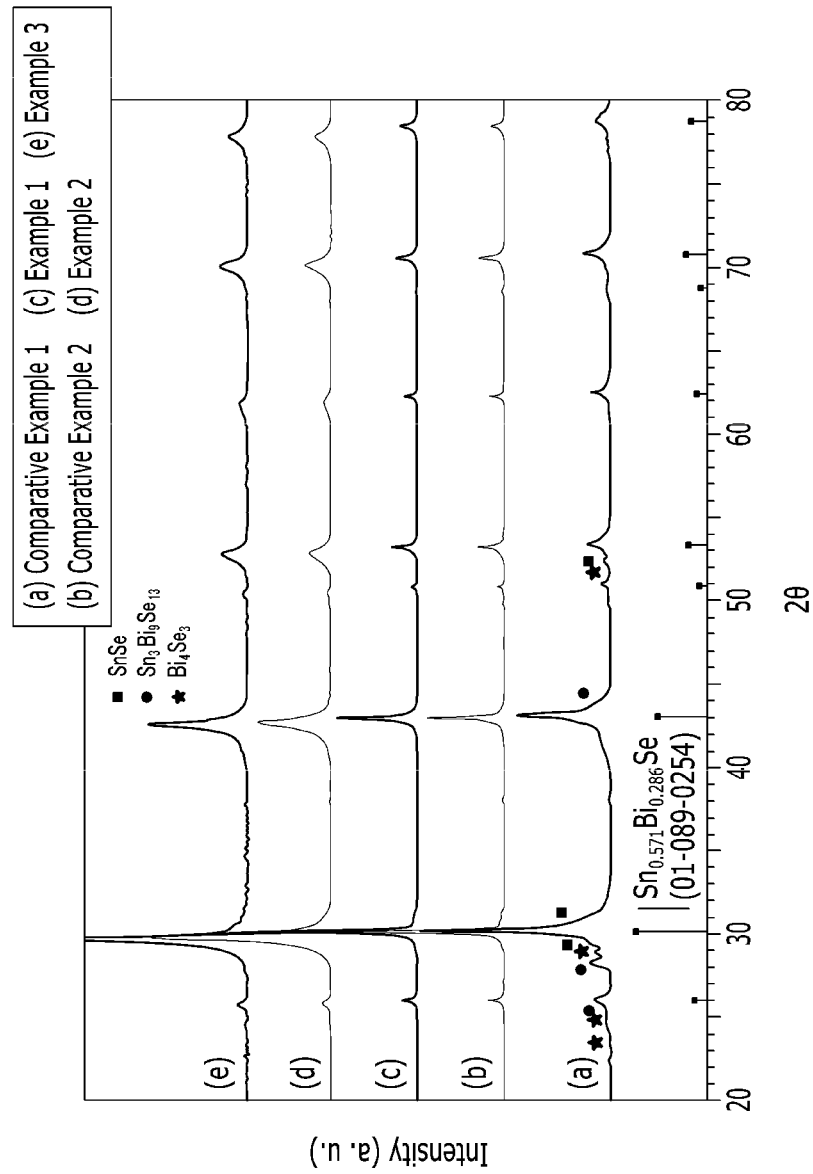
FIG. 5 is a graph showing the results of X-ray diffraction analysis after the sintered body finally produced through the sintering step in Examples 1 to 3 and Comparative Examples 1 and 2 is slowly cooled and left to stand at room temperature.

Further, referring to FIG. 5, it was confirmed that in the case of Comparative Example 1, as it exhibits poor phase stability when left at relatively low to the decomposition of the chalcogen-containing compound of $Sn_4Bi_2Se_7$ occurred and thus a plurality of secondary phases such as $Sn_3Bi_9Se_{13}$, SnSe, or $Bi_4Se_3$ were formed (peaks occurring in the vicinity of the main peaks on the XRD pattern were confirmed). However, it was confirmed that the compounds of Examples 1 to 3 and Comparative Example 2 retained the face-centered cubic lattice structure without generation of the secondary phase, and thus exhibited excellent phase stability even at a relatively low temperature. From these results, it can be seen that the sintered body forms a stable phase at a low temperature when some of the vacancies are filled with an alkali metal.

2. Results Using TOPAS Program

The lattice parameter was calculated for each of the chalcogen-containing compounds in powder state of Examples 1 to 3 and Comparative Examples 1 and 2 using the TOPAS program, and the results are shown in Table 1 below.

TABLE 1

| Powder material | Lattice parameter (Å) |
| --- | --- |
| Example 1 ($V_{0.6}Na_{0.4}Sn_4Bi_2Se_{6.8}Te_{0.2}$) | 5.9776 |
| Example 2 ($V_{0.6}Na_{0.4}Sn_4Bi_2Se_{6.2}Te_{0.8}$) | 5.9893 |
| Example 3 ($V_{0.6}Na_{0.4}Sn_4Bi_2Se_6Te_1$) | 5.9971 |
| Comparative Example 1 ($Sn_4Bi_2Se_7$) | 5.9496 |
| Comparative Example 2 ($V_{0.6}Na_{0.4}Sn_4Bi_2Se_7$) | 5.9724 |

Referring to Table 1, in the chalcogen-containing compound or Comparative Example 2, the lattice parameter was increased by Na in a vacant site relative to Comparative Example 1. In the chalcogen-containing compounds of Examples 1 to 3, by partially substituting Te having a larger atomic radius with Se relative to Comparative Example 2, the lattice parameter further increased and the cell size increased. That is, as the Te content increases, the lattice parameter due to the increase of cell size increases sequentially (Example 3>Example 2>Example 1>Comparative Example 2>Comparative Example 1).

3. Temperature Dependence of Electrical Conductivity

Figure 6:
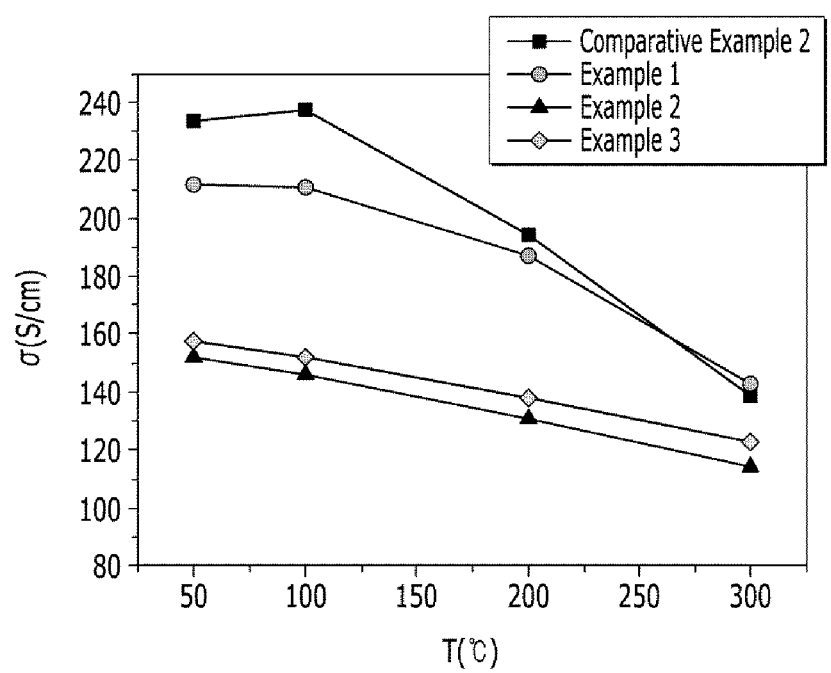
FIG. 6 is a graph showing the results of measuring electrical conductivity versus temperature of the chalcogen-containing compounds in Examples 1 to 3 and Comparative Example 2.

For the chalcogen-containing compound samples prepared in Examples 1 to 3 and Comparative Example 2, the electrical conductivity was measured according to the temperature change, and the results are shown in FIG. 6. The electrical conductivity was measured at a temperature range of 50 to 300° C. by a four-probe DC method using LSR-3 (manufactured by Linseis), which is a resistivity measuring device.

Referring to FIG. 6, the chalcogen-containing compounds of Examples 1 to 3 exhibited lower electrical conductivity than Comparative Example 2, and showed a tendency to decrease as the amount of Te substitution increased. This means that the electrical conductivity decreased due to the carrier scattering effect caused by a mass difference between Te and Se. However, in the case of Example 2 and Example 3 in which the molar ratio of Te is 0.8 and 1, the difference in electrical conductivity is not large, which indicates that when the molar ratio of Te exceeds 0.8, the carrier scattering reaches a maximum value, and thus, even if the content of Te is additionally increased, it does not cause a large change in electrical conductivity.

4. Temperature Dependence of Seebeck Coefficient

Figure 7:
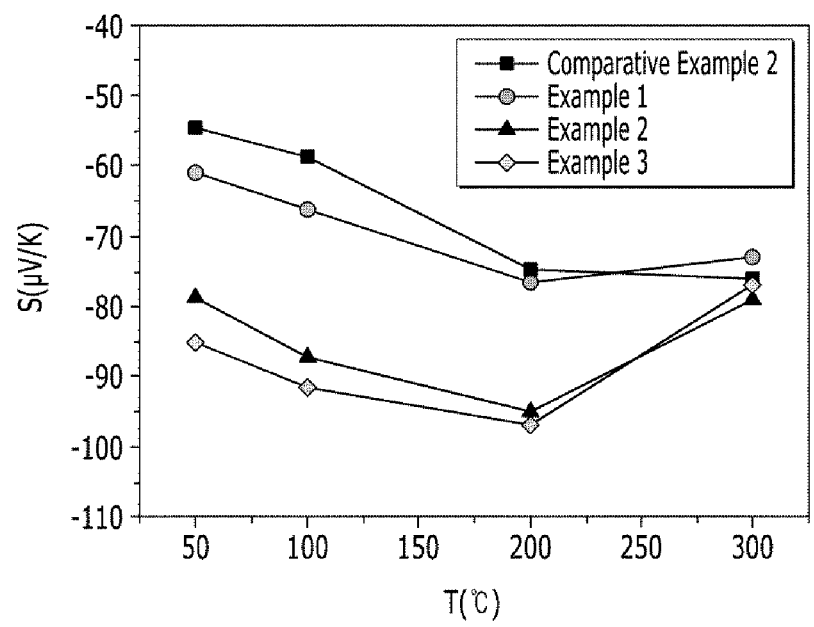
FIG. 7 is a graph showing the results of measuring the Seebeck coefficient versus temperature of the chalcogen-containing compounds in Examples 1 to 3 and Comparative Example 2.

For the chalcogen-containing compound samples prepared in Examples 1 to 3 and Comparative Example 2, the Seebeck coefficient (S) was measured according to the temperature change, and the results are shown in FIG. 7. The Seebeck coefficient was measured in a temperature range of 50 to 300° C. by using a measuring device LSR-3 (manufactured by Linseis) and applying a differential voltage/temperature technique.

As shown in FIG. 7, comparing Examples 1 to 3 and Comparative Example 2, as the content of Te increased, the Seebeck coefficient increased in the entire measured temperature section. From this result, it was confirmed that the Seebeck coefficient was improved due to Te substitution.

5. Temperature Dependence of Power Factor

Figure 8:
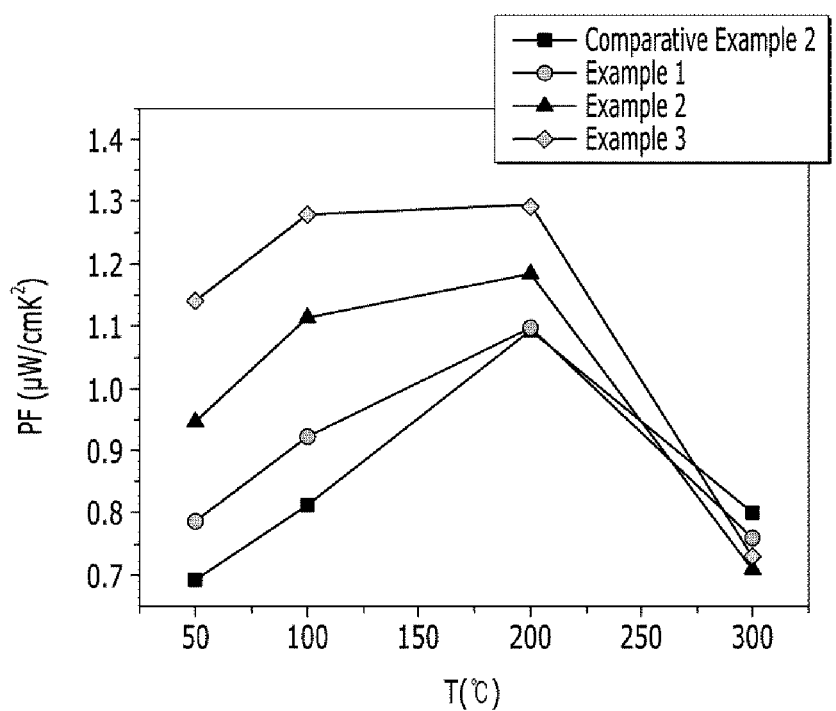
FIG. 8 is a graph showing the results of measuring the power factor versus temperature of the chalcogen-containing compounds in Examples 1 to 3 and Comparative Example 2.

For the chalcogen-containing compound samples prepared in Examples 1 to 3 and Comparative Example 2, the power factor was calculated according to the temperature change, and the results are shown in FIG. 8.

The power factor is defined as power factor (PF)=$\sigma S^2$, and was calculated using the values of $\sigma$ (electrical conductivity) and S (Seebeck coefficient) shown in FIG. 6 and FIG. 7.

As shown in FIG. 6, in Examples 1 to 3, the Seebeck coefficient was increased as the content of Te was increased, thereby showing an increased power factor, as compared with Comparative Example 2. Particularly, the average power factor of Example 3 measured at 50 to 300° C. showed a high value of 31% or more as compared with Comparative Example 2.

6. Temperature Dependence of Thermal Conductivity

Figure 9:
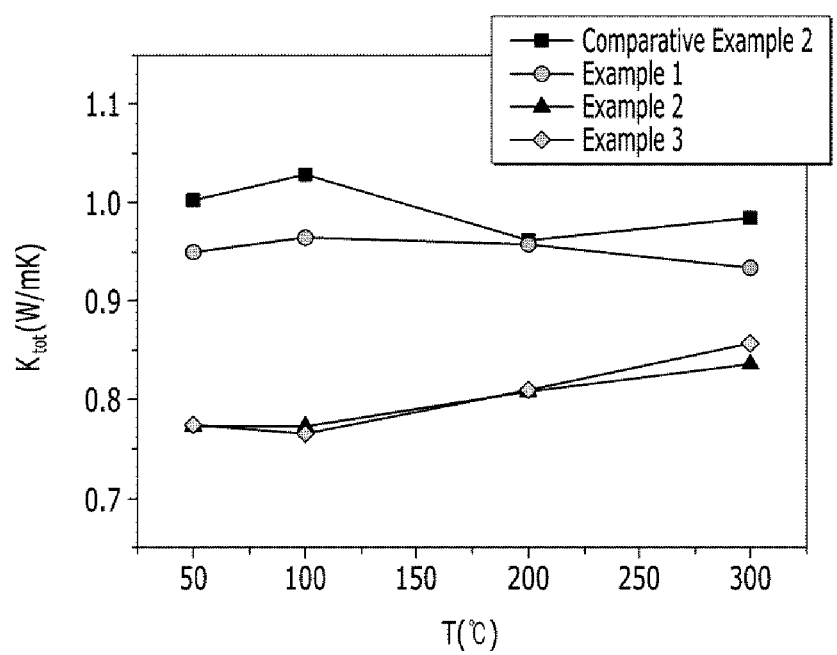
FIG. 9 is a graph showing the results of measuring the total thermal conductivity versus temperature of the chalcogen-containing compounds in Examples 1 to 3 and Comparative Example 2.
Figure 10:
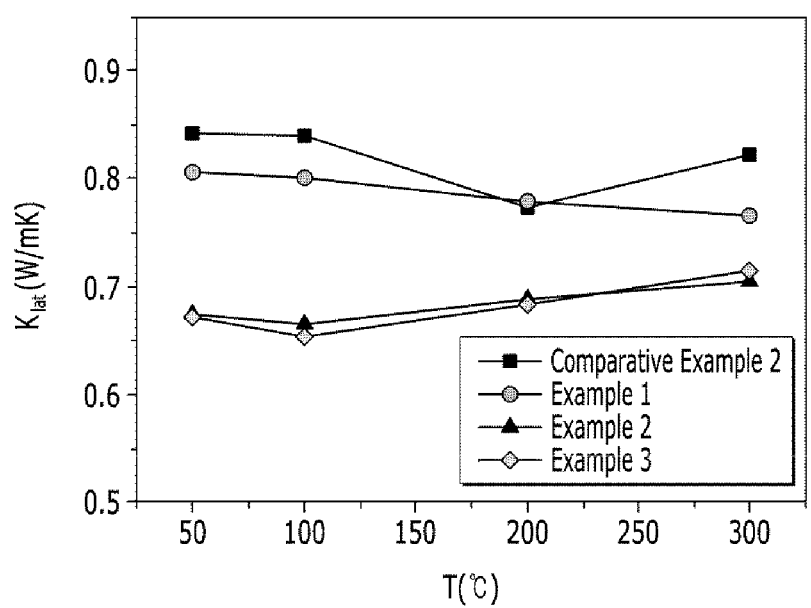
FIG. 10 is a graph showing the results of calculating the lattice thermal conductivity versus temperature of the chalcogen-containing compounds in Examples 1 to 3 and Comparative Example 2.

For the chalcogen-containing compound samples prepared in Examples 1 to 3 and Comparative Example 2, the thermal conductivity and the lattice thermal conductivity were measured according to the temperature change, and the results are shown in FIG. 9 and FIG. 10, respectively. In the measurement of the thermal conductivity, first, the thermal diffusivity (D) and the thermal capacity (Cp) were measured by applying laser scintillation method and using LFA457 (manufactured by Netzsch) which is device for measuring the thermal conductivity. The thermal conductivity (K) was calculated by applying the measured value to the equation of "thermal conductivity (K) or total thermal conductivity (Ktot)=$D\rho C_p$ ($\rho$ is the density of the sample measured by the Archimedes method)".

In addition, the total thermal conductivity (k=$k_L+k_E$) is divided into the thermal conductivity ($k_E$) calculated according to the lattice thermal conductivity ($k_L$) and the Wiedemann-Franz ($k_\varepsilon$=L$\sigma$T), wherein the value calculated from the Seebeck coefficient versus temperature was used as the Lorentz number (L).

Referring to FIG. 9 and FIG. 10, Examples 1 to 3 and Comparative Example 2 showed generally low thermal conductivity, and particularly, it was confirmed that the lattice thermal conductivity decreased as the content of Te increased, and as a result, the total thermal conductivity decreased. Specifically, the chalcogen-containing compound of Example 3 exhibited a low level of lattice thermal conductivity value (at 50 to 300° C.) from 0.65 to 0.72 W/mK due to the point defect scattering effect of a phonon resulting from vacancy and Te substitution in the face-centered cubic structure.

7. Temperature Dependence of Thermoelectric Performance Index

Figure 11:
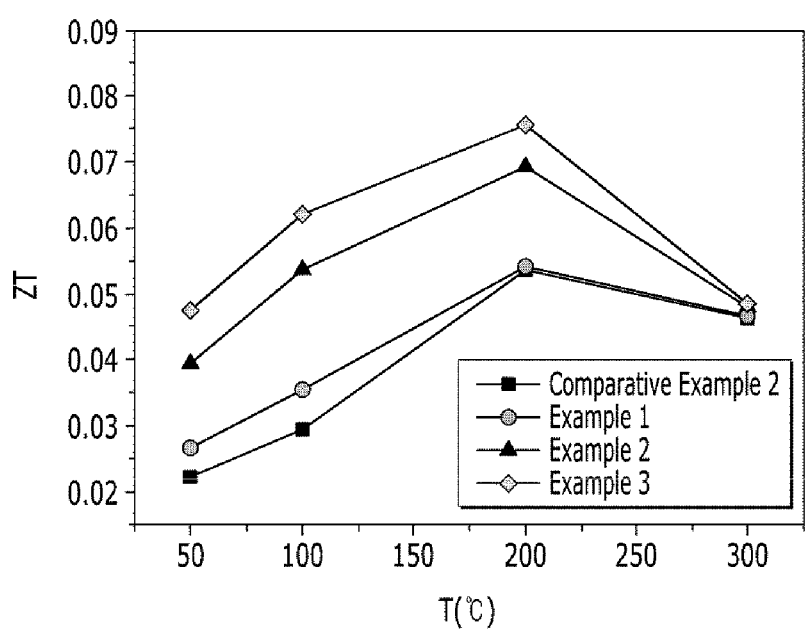
FIG. 11 is a graph showing the results of calculating the thermoelectric performance index versus temperature of the chalcogen-containing compounds in Examples 1 to 3 and Comparative Example 2.

For the chalcogen-containing compound samples prepared in Examples 1 to 3 and Comparative Example 2, the thermoelectric performance index was calculated according to temperature change, and the results are shown in FIG. 11.

The thermoelectric performance index is defined as ZT=$S^2\sigma T/k$, and was calculated by using the values of S (Seebeck coefficient), $\sigma$ (electrical conductivity), T (absolute temperature), and k (thermal conductivity) obtained in the experimental examples.

Referring to FIG. 11, as the content of Te increased, the ZT value increased. Specifically, in the case of the chalcogen-containing compound of Example 3 in which some Se was substituted with the composition of Te 1.0, the average ZT value at 50 to 300° C. was 54% or more higher than that of Comparative Example 2.

The invention claimed is:

1. A chalcogen-containing compound represented by the following Chemical Formula 1:

$$V_{1-x}M_xSn_4Bi_2Se_{7-y}Te_y \qquad \text{[Chemical Formula 1]}$$

wherein, in the above Formula 1, V is a vacancy, M is an alkali metal, x is greater than 0 and less than 1, and y is greater than 0 and less than or equal to 1, and wherein the chalcogen-containing compound has a face-centered cubic crystal lattice structure, the Se is filled in an anion site of the face-centered cubic lattice structure, the Sn and Bi are filled in a cation site of the face-centered cubic lattice structure, the Te is substituted by replacing some of the Se, the M is filled in at least some of vacant sites excluding the sites filled with Sn, Bi, Se, and Te in the face-centered cubic lattice structure, and the V is a vacant site of the remaining cationic sites.

2. The chalcogen-containing compound of claim 1, wherein the M is at least one alkali metal selected from the group consisting of Li, Na, and K.

3. The chalcogen-containing compound of claim 1, wherein the chalcogen-containing compound has a lattice parameter of 5.975 Å or more.

4. The chalcogen-containing compound of claim 1, wherein the x is 0.05 to 0.5, y is 0.1 to 1, and x+y is 0.1 to 1.5.

5. The chalcogen-containing compound of claim 1, wherein the chalcogen-containing compound is selected from the group consisting of $V_{0.6}Na_{0.4}Sn_4Bi_2Se_{6.8}Te_{0.2}$, $V_{0.6}Na_{0.4}Sn_4Bi_2Se_{6.2}Te_{0.8}$, and $V_{0.6}Na_{0.4}Sn_4Bi_2Se_6Te_1$.

6. A method for preparing the chalcogen-containing compound of claim 1, represented by the following Chemical Formula 1:

  [Chemical Formula 1]

$V_{1-x}M_xSn_4Bi_2Se_{7-y}Te_y$   [Chemical Formula 1]

wherein, in the above Formula 1, V is a vacancy, M is an alkali metal, x is greater than 0 and less than 1, and y is greater than 0 and less than or equal to 1, comprising the steps of:

mixing respective raw materials of Sn, Bi, Se, Te, and an alkali metal (M) and subjecting the mixture to a melting reaction;

heat-treating the resultant product obtained through the melting reaction;

pulverizing the resultant product obtained through the heat treatment; and sintering the pulverized product, wherein the mixing of raw materials is carried out by mixing the raw materials such that the molar ratio of Sn, Bi, Se, Te, and an alkali metal (M) is a ratio corresponding to 4:2:7-y:y:x.

7. The method for preparing the chalcogen-containing compound of claim 6, wherein the melting is carried out at a temperature of 700 to 800° C.

8. The method for preparing the chalcogen-containing compound of claim 6, wherein the heat treatment is carried out at a temperature of 550 to 640° C.

9. The method for preparing the chalcogen-containing compound of claim 6, further comprising a step of cooling the result of the heat treatment step to form an ingot between the heat treatment step and the pulverization step.

10. The method for preparing the chalcogen-containing compound of claim 6, wherein the sintering step is carried out by a spark plasma sintering method.

11. The method for preparing the chalcogen-containing compound of claim 6, wherein the sintering step is carried out at a temperature of 550 to 700° C. under a pressure of 10 to 100 MPa.

12. A thermoelectric element comprising the chalcogen-containing compound according to claim 1.

* * * * *